(12) United States Patent
Toriumi et al.

(10) Patent No.: US 10,095,108 B2
(45) Date of Patent: Oct. 9, 2018

(54) PHOTOSENSITIVE COMPOSITION AND PATTERN FORMATION METHOD

(71) Applicant: Evolving nano process Infrastructure Development Center, Inc., Tsukuba-shi (JP)

(72) Inventors: Minoru Toriumi, Tachikawa (JP); Toshiro Itani, Tsukuba (JP)

(73) Assignee: Evolving nano process Infrastructure Development Center, Inc., Tsukuba-shi (JP)

( * ) Notice: Subject to any disclaimer, the term of this patent is extended or adjusted under 35 U.S.C. 154(b) by 0 days.

(21) Appl. No.: 15/446,531

(22) Filed: Mar. 1, 2017

(65) Prior Publication Data
US 2017/0277036 A1 Sep. 28, 2017

(30) Foreign Application Priority Data

Mar. 23, 2016 (JP) ................. 2016-059026

(51) Int. Cl.
| | | |
|---|---|---|
| *G03F 7/004* | (2006.01) | |
| *G03F 7/16* | (2006.01) | |
| *G03F 7/32* | (2006.01) | |
| *G03F 7/20* | (2006.01) | |
| *G03F 7/09* | (2006.01) | |
| *C01G 23/047* | (2006.01) | |
| *H01L 21/027* | (2006.01) | |
| *C01G 27/00* | (2006.01) | |
| *C01G 25/02* | (2006.01) | |
| *G03F 7/039* | (2006.01) | |
| *B82Y 30/00* | (2011.01) | |

(52) U.S. Cl.
CPC ............ *G03F 7/0043* (2013.01); *B82Y 30/00* (2013.01); *C01G 23/047* (2013.01); *C01G 25/02* (2013.01); *C01G 27/00* (2013.01); *G03F 7/0045* (2013.01); *G03F 7/0392* (2013.01); *G03F 7/09* (2013.01); *G03F 7/162* (2013.01); *G03F 7/168* (2013.01); *G03F 7/2004* (2013.01); *G03F 7/2037* (2013.01); *G03F 7/325* (2013.01); *G03F 7/327* (2013.01); *H01L 21/0271* (2013.01); *H01L 21/0274* (2013.01)

(58) Field of Classification Search
CPC ...... G03F 7/004; G03F 7/0045; G03F 7/0392; G03F 7/0042; G03F 7/0043; G03F 7/2037; G03F 7/325; G03F 7/327; B82Y 30/00; C01G 25/02; C01G 27/00; C01G 23/047; H01L 21/0271; H01L 21/0274

USPC ...... 430/281.1, 325, 322, 326, 329; 423/492
See application file for complete search history.

(56) References Cited

U.S. PATENT DOCUMENTS

| | | | |
|---|---|---|---|
| 8,124,230 B2 | 2/2012 | Zimmerman et al. | |
| 8,415,000 B2 | 4/2013 | Stowers et al. | |
| 9,696,624 B2* | 7/2017 | Thackeray | ............ G03F 7/0382 |
| 2009/0297784 A1* | 12/2009 | Xu | ............. G03F 7/039 |
| | | | 428/172 |
| 2015/0234272 A1* | 8/2015 | Sarma | .............. G03F 7/0045 |
| | | | 430/281.1 |

FOREIGN PATENT DOCUMENTS

| | | |
|---|---|---|
| CN | 101963755 A | 2/2011 |
| CN | 102639432 A | 8/2012 |
| JP | 2012-185484 | 9/2012 |
| JP | 2013-216856 A | 10/2013 |
| JP | 2014-108985 A | 6/2014 |
| JP | 2014-160228 A | 9/2014 |
| JP | 2015-157807 A | 9/2015 |
| JP | 2017-36435 A | 2/2017 |
| WO | WO 2015/111664 A1 | 7/2015 |
| WO | WO 2016/111300 A1 | 7/2016 |

OTHER PUBLICATIONS

Gregg M. Gallatin et al. "Fundamental Limits to EUV Photoresist," Advances in Resist Materials and Processing Technology XXIV, Proc. of SPIE vol. 6519, 2007, pp. 10.
Katsuhide Shinmou et al. "Fine-Patterning of $ZrO_2$ Thin Films by the Photolysis of Chemically Modified Gel Films," Jpn. J. Appl. Phys. vol. 33, Part 2, No. SB, 150.29.185.123, Aug. 1994, pp. 5.
Office Action dated Dec. 8, 2017 in Korean Patent Application No. 10-2017-0029958 (with English translation), 11 pages.
Combined Taiwanese Office Action and Search Report dated Jan. 4, 2018 in Taiwanese Patent Application No. 106107231 (with English translation), 9 pages.
Office Action dated Jan. 16, 2018 in Japanese Patent Application No. 2016-059026 (with English language translation) 7 pages.

* cited by examiner

*Primary Examiner* — Amanda C. Walke
(74) *Attorney, Agent, or Firm* — Oblon, McClelland, Maier & Neustadt, L.L.P.

(57) ABSTRACT

According to one embodiment, a photosensitive composition includes a great number of photosensitive core-shell type nano-particles each including a core and a shell and having a structure that the core is metal oxide particle and covered by the shell. The shell includes a) unsaturated carboxylic acid or unsaturated carboxylate, which is a negatively ionized unsaturated carboxylic acid, and b) silylated unsaturated carboxylic acid or unsaturated carboxylate which is negatively ionized silylated unsaturated carboxylic acid.

9 Claims, No Drawings

PHOTOSENSITIVE COMPOSITION AND PATTERN FORMATION METHOD

CROSS-REFERENCE TO RELATED APPLICATIONS

This application is based upon and claims the benefit of priority from prior Japanese Patent Application No. 2016-059026, filed Mar. 23, 2016, the entire contents of which are incorporated herein by reference.

BACKGROUND OF THE INVENTION

1. Field of the Invention

The present invention relates to a photosensitive composition used in a process of manufacturing a semiconductor device, or the like, and a pattern formation method using the photosensitive composition.

2. Description of the Related Art

As the integration and speed of LSI increase, the miniaturization of the pattern rule is quickly progressing. As the leading edge of miniaturization technology, an ArF immersion lithography is used for mass-production of semiconductor devices. As a lithography technology of the next-generation, an extreme-ultraviolet (EUV) lithography with a wavelength of 13.5 nm and the like are further researched and developed.

In recent years, with progress of the miniaturization of patterns, the thickness of the resist, which is a photosensitive composition used for pattern formation, is reduced. Therefore, when etching is carried out on an underlying layer using a micro-patterned resist as a mask, such a drawback arises prominently that the etching resistance of the resist is insufficient. In order to reinforce the etching resistance of this resist, various resist materials containing metal oxides having resistance to etching are examined.

However, the resist materials containing metal oxides entail a drawback of low storage stability or low coating stability. The drawback of low coating stability is created as follows. That is, when a resist solution is applied by spin-coating on a wafer and dried by heat to form a resist film, the characteristics of the film varies before the pattern is drawn. In other words, there is a dependency on the post-coating delay (PCD) time, and therefore the sensitivity of the resist at pattern exposure varies. The conventional resists containing metal oxides have insufficient storage stability. Unlike general-use silicon-containing compositions, a metal oxide with the skeleton of a transition metal may act to change the molecular structure in the composition when stored for long time. If such a resist solution is used, a pattern defect may likely be created during the manufacture of semiconductor devices.

BRIEF SUMMARY OF THE INVENTION

An object of the present invention is to provide a photosensitive core-shell type nano-particle with excellent storage stability and coating stability, and a pattern formation method using the composition.

According to an embodiment, there is provided a photosensitive composition comprising a great number of photosensitive core-shell type nano-particles each including a core and a shell and having a structure that the core is metal oxide particle and covered by the shell, the shell containing: a) unsaturated carboxylic acid or unsaturated carboxylate, which is a negatively ionized unsaturated carboxylic acid; and b) silylated unsaturated carboxylic acid or unsaturated carboxylate which is negatively ionized silylated unsaturated carboxylic acid.

According to an embodiment, there is provided a pattern formation method comprising: applying a solution of the photosensitive composition on a substrate to be processed; forming a photosensitive composition film on the above-mentioned substrate to be processed by heat treatment; exposing the photosensitive composition film to a high energy beam; and developing the film using a developer.

DETAILED DESCRIPTION OF THE INVENTION

Hereafter, a photosensitive composition and a pattern formation method according to an embodiment will be described. The photosensitive composition according to the embodiment contains a number of photosensitive core-shell type nano-particles.

<Photosensitive Core-Shell Type Nano-Particles>

The photosensitive core-shell type nano-particles have the structure that a core is enclosed by a shell.

The core may be a fine particle of an oxide of a metal selected from the group consisting of Ti, Zr and Hf, for example. Specific examples thereof are titanium oxide fine particles, zirconium oxide fine particles and hafnium oxide fine particles. It is desirable in practical use to select appropriate type of particles from those metal oxide particles mentioned with consideration of resist characteristics such as the optical property and the resistance to dry-etching.

The core should preferably be spherical or approximately spherical. The production method of the metal oxide particles, that is, the cores, is not particularly limited, but any well-known method may be employed. Examples of the production method of the metal oxide fine particles are hydrolytic methods such as co-precipitation, salt solution method, alkoxide method and sol-gel method, hydrothermal methods such as sedimentation, crystallization, pyrohydrolysis and hydrothermal oxidation, and thermal decomposition methods such as spray drying, flame atomization, plasma process, vapor phase reaction, freeze drying, heating kerosene method and heating petroleum method. Moreover, it is also desirable to combine two or more of these techniques.

Various methods of producing a metal oxide particle are known in this technical field, an example of which is discussed in U.S. Pat. No. 8,124,230.

A shell encloses a core. The shell contains: a) an unsaturated carboxylic acid or an unsaturated carboxylate, which is a negative ion of the unsaturated carboxylic acid; and b) a silylated unsaturated carboxylic acid or an unsaturated carboxylate which is negative ion of the silylated unsaturated carboxylic acid.

According to an embodiment, a shell comprises the component b) bound to the surface of the core, and the component a) bound to the surface of the core, which includes component b).

Usable examples of the unsaturated carboxylic acid, which is the component a) are acrylic acid, methacrylic acid, vinylbenzoic acid, maleic acid and fumaric acid.

As the component b, which is the silylated unsaturated carboxylic acid or the unsaturated carboxylate which is the negative ion of the silylated unsaturated carboxylic acid, a silane coupling agent can be used. Examples of the silane coupling agent include an organic compound expressed by the following general formula (1).

$$X^1-R^1-Si(CH_3)_n(-OR^2)_{3-n} \qquad (1)$$

where $X^1$ in the formula represents a functional group selected from the group consisting of a straight chain, a branched acrylic group and a methacrylic group, which have a carbon number of 1 to 20, $R^1$ represents an alkylene group having a carbon number of 1 to 5, $R^2$ represents an alkyl group having a carbon number of 1 to 5 or hydrogen atom and n is an integer of 0 or 1.

Specific Examples of the silane coupling agent expressed by the general formula (1) are:

 and

The amount of the silane coupling agent, which is the component b), for the core (metal oxide fine particles) should desirably be 0.01 to 2 mol, or more preferably, 0.1 to 1 mol of the metal oxide fine particles.

The amount of the unsaturated carboxylic acid or its unsaturated carboxylate, which is the component a) for the core (metal oxide fine particles) should desirably be 0.01 to 5 mol, or more preferably, 0.1 to 2 mol of the metal oxide fine particles.

Thus, by specifying the molar amount of each of the unsaturated carboxylic acid or unsaturated carboxylate of the component a), and the silylated unsaturated carboxylic acid or the silylated unsaturated carboxylate of the component b), which forms the shell, with respect to the core, it becomes possible to obtain a photosensitive core-shell type nano-particles having further improved storage stability and coating stability and exhibiting high photosensitivity.

The grain size of the photosensitive core-shell type nano-particles can be measured by dynamic light scattering, and the average particle diameter should desirably be 0.1 to 10 nm, or more preferably, 1 to 5 nm. When a photosensitive composition containing the photosensitive core-shell type nano-particles having such a range of average particle diameters is adopted to pattern formation, further fine patterns can be formed.

<Solvent>

When a photosensitive composition according to the embodiment is blended with a solvent, a photosensitive composition solution, the so-called resist solution is prepared. Examples of the solvent include water, methanol, ethanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-2-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, octanol, methyl lactate, ethyl lactate, propyl lactate, butyl lactate, propylene glycol, butanediol monomethyl ether, propylene glycol monomethyl ether, butanediol monoethyl ether, propylene glycol monoethyl ether, butanediol monopropyl ether, propylene glycol monopropyl ether, propylene glycol monomethoxymethyl ether, propylene glycol monomethyl ether acetate, diacetone alcohol, allyl alcohol, propargyl alcohol, 3-methyl-1-pentyn-3-ol, 3-methyl-1-butyn-3-ol, furfuryl alcohol, tetrahydrofurfuryl alcohol and glycidol. The solvent may be used solely or in combination of two or more.

The photosensitive composition according to the embodiment may further contain a photo acid generator, a surfactant and the like in a range which does not impair the effect.

<Photo Acid Generator>

A photo acid generator is a compound which can generate an acid as it decomposes with a high energy beam used by the exposure process described later. Various photo acid generators are known in this technical field, and they can be used for the photosensitive composition according to this embodiment.

In exposure to a high energy beam, sulfonic acid or carboxylic acid generated from the photo acid generator is coordinated to the metal oxide particles of the photosensitive core-shell type nano-particles to improve the solubility of the photosensitive core-shell type nano-particles to alkalis. Thus, a high-contrast positive photosensitive composition can be obtained.

In exposure to an electron beam (EB) or extreme ultraviolet radiation (EUV), a great number of secondary electrons are generated from the metal oxide particles of the photosensitive core-shell type nano-particle, and the secondary electrons transfer the energy to the photo acid generator to raise the decomposition efficiency of the photo acid generator. As a result, the addition of an photo acid generator contributes not only to the contrast but also to the improvement in sensitivity.

The photo acid generator may be of any type as long it a compound which generates an acid by exposure (irradiation) to high energy beam. Preferable examples of the photo acid generator are sulfonium salt, iodonium salt, sulfonyldiazomethane, N-sulfonyloxyimide and oxime-O-sulfonate.

Examples of the photo acid generator include bis(4-tert-butylphenyl)iodonium perfluoro-1-butanesulfonate, bis(4-tert-butylphenyl)iodonium p-toluene sulfonate, bis(4-tert-butylphenyl)iodonium triflate, Boc-methoxyphenyldiphenylsulfonium triflate, (4-bromophenyl) diphenylsulfonium triflate, (tert-butoxycarbonylmethoxynaphthyl)diphenyl sulfonium triflate, (4-tert-butylphenyl)diphenyl sulfonium triflate, diphenyliodonium hexafluorophosphate, diphenyl iodonium nitrate, diphenyliodonium perfluoro-1-butanesulfonate, diphenyliodonium p-toluene sulfonate, diphenyl iodonium triflate, (4-fluorophenyl)diphenylsulfonium triflate, N-hydroxynaphthalimide triflate, N-hydroxy-5-norbornane-2,3-dicarboxamide perfluoro-1-butanesulfonate, (4-iodophenyl) diphenylsulfonium triflate, (4-methoxyphenyl) diphenylsulfonium triflate, 2-(4-methoxystyryl)-4,6-bis (trichloromethyl)-1,3,5-triazine, (4-methylphenyl) diphenylsulfonium triflate, (4-methylthiophenyl) methylphenyl=sulfonium triflate, (4-phenoxyphenyl) diphenylsulfonium triflate, (4-phenylthiophenyl) diphenyl sulfonium triflate, triarylsulfonium hexafluorophosphate salt, triphenylsulfonium perfluoro-1-butanesulfonate, triphenylsulfonium triflate, tris(4-tert-butylphenyl)sulfonium perfluoro-1-butanesulfonate and tris(4-tert-butylphenyl) sulfonium triflate. The photo acid generator may be used solely or in combination of two or more.

The amount of the photo acid generator occupying in the photosensitive composition of the embodiment should desirably be 0.5 to 20% by weight per 1 g of the photosensitive core-shell type nano-particles.

Next, the pattern formation method according to the embodiment will be described.

The pattern formation method according to the embodiment comprises preparing a photosensitive composition solution (resist solution) by dissolving the photosensitive composition containing a great number of photosensitive core-shell type nano-particles into a solvent described above, applying the resist solution on a substrate to be processed, forming a resist film by heat treatment, exposing the resist film to a high energy beam and developing the resist film using a developer.

(Preparation of Resist Solution)

The feature of the resist solution is that the photosensitive core-shell type nano-particles are dissolved in the solvent while maintaining the structure of the particles. The concentration of the photosensitive core-shell type nano-particles in the resist solution is not generally limited due to the materials for the cores and shells which form the photosensitive core-shell type nano-particles, the ratio between the components a) and b) of the shells or the like, but should desirably be 1 to 20% by weight, or more preferably, 0.1 to 10% by weight.

(Coating)

Examples of the substrate to be processed include a substrate used to manufacture an integrated circuit, a substrate used to manufacture an integrated circuit, which includes a layer to be processed (Si, $SiO_2$, SiN, SiON, TiN, WSi, BPSG, SOG, an organic antireflection film, etc.) on a surface thereof, a substrate used to manufacture a mask circuit, and a substrate used to manufacture a mask circuit, which includes a layer (Cr, CrO, CrON, MoSi, $SiO_2$, etc.) to be processed on a surface thereof.

Examples of the coating technique adoptable here include spin coat, roll coat, flow coat, dip coat and spray coat. The thickness of the coating should desirably be 5 nm to 2 μm.

(Exposure)

The heat treatment should desirably be, for example, prebaking on a hot plate at 60 to 150° C. for 10 seconds to 30 minutes, preferably, at 80 to 120° C. for 30 seconds to 20 minutes.

The exposure process is performed using a predetermined mask. But, when using electron rays as a high energy beam, the exposure process is carried out by irradiating electron rays in the pattern by a step-and-repeat method or the like. Examples of the high energy beam include excimer lasers of such as KrF, ArF, Xe, $F_2$ and $Ar_2$, an excimer lamp, extreme ultraviolet radiation (EUV), and electron beams (EB). Note that a preferable high energy beam is extreme ultraviolet radiation (EUV). By the high energy beams at the exposure, decomposition and substitution reaction occur mainly in the component a) of the shell of the photosensitive core-shell type nano-particles and thus the solubility to the developer used in the next step can be improved.

In the exposure process with high energy beam, it is desirable to use, as the light source, EUV light having a wavelength of 3 to 15 nm or an electron beam having an acceleration voltage of 1 to 150 keV.

The light exposure should preferably be about 0.1 $mJ/cm^2$ to 1 $J/cm^2$, especially about 10 to 100 $mJ/cm^2$ or about 0.50 $\mu C/cm^2$ to 5 $mC/cm^2$, or more preferably, 50 to 500 $\mu C/cm^2$.

The postbaking (PB) after exposure should desirably be carried out, for example, at 60 to 150° C. for 10 seconds to 30 minutes, or more preferably, at 80 to 120° C. for 30 seconds to 20 minutes. The postbaking may be omitted.

(Development Process)

Examples of the developer are alkaline aqueous solutions selected from tetramethylammonium hydroxide (TMAH), tetraethylammonium hydroxide (TEAH), tetrapropylammonium hydroxide (TPAH) and tetrabutylammonium hydroxide (TBAH). The concentration of the alkaline aqueous solution should preferably be 0.1 to 30% by weight, more preferably, 0.1 to 5% by weight, even more preferably 2 to 3% by weight.

Examples of the adoptable developer other than the alkaline aqueous solutions are ethylamine, propylamine, n-butylamine, dimethylamine, diethylamine, dipropylamine, di-n-butylamine, trimethylamine, triethylamine, tri-n-propylamine, tri-n-butylamine. In these developers, the concentration should desirably be 0.1 to 30% by weight.

The developing time is 3 seconds to 3 minutes, or preferably 5 seconds to 2 minutes.

The development process can adopt a conventional method such as dip coating, a puddle method or a spray method.

With the development process, portions irradiated with the high energy beam (that is, exposed portion) are dissolved into the developer, and the other portions not exposed (unexposed portion) are not dissolved, and thus the target positive pattern is formed on the substrate.

After the development, the resultant is rinsed with pure water, and dried by, for example, spin dry. Thus, the target pattern is obtained.

The development described above is positive type development which dissolves portions exhibiting acidity and having polarity. Besides the positive type, it is also possible to adopt the negative type development, which obtains a reversal pattern with a developer containing an organic solvent.

Examples of the adoptable developer for the negative type development include polar solvents such as of ketones, esters, alcohols, amides and ethers, and hydrocarbon-based solvents.

Examples of the ketone solvent include 1-octanone, 2-octanone, 1-nonanone, 2-nonanone, acetone, 2-heptanone (methylamyl ketone), 4-heptanone, 1-hexanone, 2-hexanone, diisobutyl ketone, cyclohexanone, methylcyclohexanone, phenylacetone, methylethyl ketone, methylisobutyl ketone, acetylacetone, acetonylacetone, ionone, diacetonyl alcohol, acetyl carbinol, acetophenone, methylnaphthyl ketone, isophorone and propylene carbonate.

Examples of the ester solvent include methyl acetate, butyl acetate, ethyl acetate, isopropyl acetate, pentyl acetate, isopentyl acetate, amyl acetate, propyleneglycol monomethylether acetate, ethyleneglycol monoethylether acetate, diethyleneglycol monobutylether acetate, diethyleneglycol monoethylether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol, glycol-based solvents such as ethylene glycol, diethylene glycol and triethylene glycol, and glycol ether-based solvents such as ethyleneglycol monomethyl ether, propyleneglycol monomethyl ether, ethyleneglycol monoethyl ether, propyleneglycol monoethyl ether, diethyleneglycol monomethyl ether, triethyleneglycol monoethyl ether and methoxy methylbutanol.

Examples of the ether-based solvent include dioxane and tetrahydrofuran besides the above-listed glycol-ether solvents.

Examples of the amide-based solvent include N-methyl-2-pyrrolidone, N,N-dimethylacetamide, N,N-dimethylformamide, hexamethyl phosphoric triamide and 1,3-dimethyl-2-imidazolidinone.

Examples of the hydrocarbon-based solvent include aromatic hydrocarbon solvents such as toluene and xylene and aliphatic-hydrocarbon solvents such as pentane, hexane, octane and decane.

The above-listed solvents may be used in mixture of two or more, or may be mixed with a solvent other than those listed above and water.

However, in order to fully exhibit the advantageous effect of the photosensitive composition according to the embodiment, it is desirable that the water content of the developer be less than 10% by weight, more preferably, it should not contain substantially water.

That is, the amount of the organic solvent occupying in the developer comprising an organic solvent should desirably be 90% by weight or more but 100% by weight or less to the entire amount of the developer, or more preferably, 95% by weight or more but 100% by weight or less.

As described above, the photosensitive composition according to the embodiment comprises a great number of photosensitive core-shell type nano-particles, each having a structure including a core, which is a metal oxide fine particle and a shell covering the core, wherein the shell contains a) an unsaturated carboxylic acid or an unsaturated carboxylate, which is a negative ion of the unsaturated carboxylic acid; and b) a silylated unsaturated carboxylic acid or an unsaturated carboxylate which is negative ion of the silylated unsaturated carboxylic acid. Such a photosensitive composition has excellent storage stability and coating stability.

That is, the conventionally known photosensitive composition containing a core-shell type nano-particles has the structure that the core is formed from metal oxide fine particle (of, for example, hafnium oxide fine particle) and the shell is formed of acrylic acid, in which the shell of acrylic acid is bound by coordinate bond to the core of hafnium oxide fine particle. Further, conventionally, the core is formed from zirconium oxide fine particle or titanium oxide fine particle, besides hafnium oxide fine particle.

However, for example, hafnium oxide fine particle as a material used core, has a high catalytic performance, and therefore exhibits a high activity. For this reason, if a shell of acrylic acid is abound by coordinate bond to a core of hafnium oxide fine particle, the active site of the core cannot be sufficiently covered but exposed from the surface. Further, when the core-shell type nano-particles are dissolved into a solvent, the core-shell structure can no longer be maintained. When such a solution (resist solution) is stored in a container for long, the cores bond together and coagulate, and therefore the storage stability is degraded.

Moreover, when the resist solution is applied to, for example, a substrate to form a resist film, cores bond together and coagulate immediately after the formation of the film, and thus the film state becomes unstable in a short time.

According to the photosensitive core-shell type nano-particles contained in the photosensitive composition according to the embodiment, the active site of the core of metal oxide particle (of, for example, hafnium oxide fine particle) can be capped effectively with the component b) of silylated unsaturated carboxylic acid or silylated unsaturated carboxylate. Moreover, the shell contains the component a) of unsaturated carboxylic acid or unsaturated carboxylate and the component b) of silylated unsaturated carboxylic acid or silylated unsaturated carboxylate. With this structure, when dissolving the photosensitive composition into a predetermined solvent to prepare a resist solution, the composition can be dissolved into the solvent while maintaining the structure of the core-shell type nano-particles. As a result, the resist solution containing the photosensitive core-shell type nano-particle can be stored in the container stably over a long period of time.

Furthermore, when a resist film is formed by applying the resist solution onto a substrate, for example, the active site of the core can be capped efficiently with the component b) of silylated unsaturated carboxylic acid or silylated unsaturated carboxylate, and therefore the binding and coagulation of the core-shell type nano-particles, which easily occur immediately after film formation, can be prevented. Thus, the long-term stability of the resist film after coating can be secured.

As described above, fine patterns can be stably formed by applying the photosensitive composition according to the embodiment to the pattern formation.

Moreover, the photosensitive composition containing the photosensitive core-shell type nano-particles according to the embodiment exhibiting the above-described features may be dissolved into a solvent to prepare a photosensitive composition solution (resist solution). The resist solution may be applied to a substrate to be processed, and then subjected to heat treatment to form a resist film. The resist film may be exposed to, for example, EUV having a wavelength of 13.5 nm as a light source, followed by development, thereby forming a pattern with desired fine dimensions.

Thus obtained pattern having desired fine dimensions of the embodiment contains a great number of metal oxide particles, and therefore it can be used as a hard mask for manufacturing various integrated circuits or masks.

EXAMPLES

Hereafter, examples and comparative examples of the present invention will be described in detail.

Example 1

<Synthetic Example 1 of Photosensitive Core-Shell Type Nano-Particle>

To 200 g of a propyleneglycolmonomethyl ether solution containing 10 g of zirconium (IV)isopropoxide, 35 g of a propyleneglycol monomethyl ether solution in which 2.2 g of methacrylic acid-3-(trimethoxysilyl)propyl was hydrolyzed with 0.2 g of 1M-hydrochloric acid, was instilled, and the mixture was agitated for 30 minutes. To the mixture, 9 g of a propyleneglycolmonomethyl ether solution containing 1.6 g of methacrylic acid was instilled, and the mixture was agitated for 1 hour, and then further agitated at 65° C. for 1 hour. Then, the solvent of the solution was evaporated by an evaporator to be removed, and the resultant was refined by re-precipitation using distilled water/acetone, followed by vacuum dry overnight.

Thus, 2.0 g of photosensitive core-shell type nano-particles was obtained, in which the core is formed from zirconium oxide particle and the shell is formed on the surface of the core. The shell is formed from the silylated methacrylic acid bound to the surface of the core and the methacrylic acid bound to the surface of the core, which is bound with the silylated methacrylic acid. The amount of the silylated methacrylic acid was 1 mol to 1 mol of the zirconium oxide particles, and the amount of the methacrylic acid was 0.5 mol to 1 mol of the zirconium oxide particles.

<Preparation Example 1 of Resist Solution>

The obtained great number of photosensitive core-shell type nano-particles were dissolved into propyleneglycol-1-monomethylether-2-acetate, and a resist solution having a concentration of 5% by weight was prepared.

<Measurement of Particle-Size Distribution of Resist Solution>

The particle-size distribution of the resist solution at 25° C. was measured using Zetasizer Nano ZS of Malvern Instruments Co. The result indicated that the average particle diameter of the photosensitive core-shell type nano-particles was 1.3 nm.

<Evaluation in Post-Coating Delay (PCD) Characteristics of Resist After Coating>

The resist solution obtained was applied on a silicon wafer by spin-coating, and dried by heating at 100° C. for 60 seconds, thus forming a resist film having a thickness of 50 nm, as a sample. Two samples were prepared.

Then, the first sample was exposed to EUV and developed with butyl acetate for 30 seconds. The sensitivity curve of the sample was obtained, and the result indicated that the sensitivity was 1 mJ/cm$^2$.

The second sample was let stand for 17 hours in clean room, and then exposed to EUV, followed by development with butyl acetate for 30 seconds. The sensitivity curve of the sample was obtained, and the result indicated that the sensitivity was 1 mJ/cm$^2$, exhibiting no change.

Thus, it has been confirmed that the resist film prepared in Example 1 has a long-term stability.

<Evaluation of Patterning Characteristics of Resist>

The resist solution obtained was applied on a silicon wafer by spin-coating, and dried by heating at 100° C. for 60 seconds, thus forming a resist film having a thickness of 50 nm. Then, the resist film was exposed to EUV using an EUV exposure device through a mask at a light exposure of 9 mJ/cm$^2$ and developed with butyl acetate for 30 seconds, thus forming a pattern.

The obtained pattern was observed under a scanning electron microscope. The result indicated that the pattern was produced with high fidelity as a line width of 12 nm to the mask.

Comparative Example 1

<Synthetic Example 2 of Photosensitive Core-Shell Type Nano-Particle>

To 60 g of a propyleneglycolmonomethyl ether solution containing 10 g of zirconium (IV)isopropoxide, 1.1 mL of distilled water and 60 g of a propyleneglycol monomethyl ether solution were instilled while agitating the solution, and the mixture was agitated for 1 hour. Then, the mixture was further agitated at 65° C. for 1 hour. While agitating the solution, 25 g of a propyleneglycolmonomethyl ether solution containing 4.2 g of methacrylic acid was instilled thereto, and the mixture was agitated for 2 hours, and further agitated at 65° C. for 1 hour. Thereafter, the solvent of the solution was evaporated by an evaporator to be removed, and the resultant was refined by re-precipitation using distilled water/acetone, followed by vacuum dry overnight.

Thus, 2.3 g of photosensitive core-shell type nano-particles in which the core is formed from zirconium oxide particle and the shell is formed of methacrylic acid bound to the surface of the core were obtained. The amount of the methacrylic acid was 1.5 mol to 1 mol of the zirconium oxide particles.

<Preparation Example 2 of Resist Solution>

The obtained great number of photosensitive core-shell type nano-particles were dissolved into propyleneglycol-1-mono-methylether-2-acetate, and a resist solution having a concentration of 5% by weight was prepared.

<Evaluation in PCD Characteristics of Resist After Coating>

The resist solution obtained was applied on a silicon wafer by spin-coating, and dried by heating at 100° C. for 60 seconds, thus forming a resist film having a thickness of 50 nm, as a sample. Two samples were prepared.

Then, the first sample was exposed to EUV and developed with butyl acetate for 30 seconds. The sensitivity curve of the sample was obtained, and the result indicated that the sensitivity was 1 mJ/cm$^2$.

The second sample was let stand for 6 hours in clean room, and then exposed to EUV, followed by development with butyl acetate for 30 seconds. The sensitivity curve of the sample was obtained. The result indicated that a light exposure of 5 mJ/cm$^2$ was required, and thus the sensitivity was poor.

Thus, it has been confirmed that the resist film prepared in Comparative Example 1 becomes unstable in a short time.

Example 2

<Synthetic Example 2 of Photosensitive Core-Shell Type Nano-Particle>

With a method similar to Synthetic Example 1 described above, except that 12 g of hafnium(IV)isopropoxide was used in place of 10 g of zirconium(IV)isopropoxide, 2.7 g of photosensitive core-shell type nano-particles was obtained, in which the core is formed from hafnium oxide particle and the shell is formed on the surface of the core. The shell is formed from the silylated methacrylic acid bound to the surface of the core and the methacrylic acid bound to the surface of the core, which is bound with the silylated methacrylic acid. The amount of the silylated methacrylic acid was 1 mol to 1 mol of the hafnium oxide particles, and the amount of methacrylic acid was 0.5 mol to 1 mol of the hafnium oxide particles.

<Preparation Example 3 of Resist Solution>

The obtained great number of photosensitive core-shell type nano-particles were dissolved into propyleneglycol-1-monomethylether-2-acetate, and a resist solution having a concentration of 5% by weight was prepared.

<Measurement of Particle-Size Distribution of Resist Solution>

The particle-size distribution of the resist solution at 25° C. was measured using Zetasizer Nano ZS of Malvern Instruments Co. The result indicated that the average particle diameter of the photosensitive core-shell type nano-particles was 2.3 nm.

<Evaluation in Post-Coating Delay (PCD) Characteristics of Resist After Coating>

The resist solution obtained was applied on a silicon wafer by spin-coating, and dried by heating at 100° C. for 60 seconds, thus forming a resist film having a thickness of 50 nm, as a sample. Two samples were prepared.

Then, the first sample was exposed to EUV and developed with butyl acetate for 30 seconds. The sensitivity curve of the sample was obtained. Meanwhile, the second sample was let stand for 5 hours in clean room, and then exposed to EUV, followed by development with butyl acetate for 30 seconds. The sensitivity curve of the sample was obtained. The result indicated that no change was observed in sensitivity between the second resist film, which was let stand for 5 hours, and the first resist immediately after coating.

Thus, it has been confirmed that the resist film prepared in Example 2 has a long-term stability.

<Evaluation of Patterning Characteristics of Resist>

The resist solution obtained was applied on a silicon wafer by spin-coating, and dried by heating at 100° C. for 60 seconds, thus forming a resist film having a thickness of 50 nm. Then, the resist film was exposed to EUV through a mask at a light exposure of 20 mJ/cm$^2$ and developed with butyl acetate for 30 seconds, thus forming a pattern.

The obtained pattern was observed under a scanning electron microscope. The result indicated that the pattern was produced with high fidelity as a line width of 20 nm to the mask.

Example 3

<Synthetic Example 3 of Photosensitive Core-Shell Type Nano-Particle>

With a method similar to Synthetic Example 1 described above, except that 8.5 g of titanium(IV)isopropoxide was used in place of 10 g of zirconium(IV)isopropoxide, 1.5 g of photosensitive core-shell type nano-particles in which the core is formed from titanium oxide particle and the shell is formed on the surface of the core were obtained. The shell is formed from the silylated methacrylic acid bound to the surface of the core and the methacrylic acid bound to the surface of the core, which is bound with the silylated methacrylic acid. The amount of the silylated methacrylic acid was 1 mol to 1 mol of the titanium oxide particles, and the amount of methacrylic acid was 0.5 mol to 1 mol of the titanium oxide particles.

<Preparation Example 4 of Resist Solution>

The obtained great number of photosensitive core-shell type nano-particles were dissolved into propyleneglycol-1-monomethylether-2-acetate, and a resist solution having a concentration of 5% by weight was prepared.

<Measurement of Particle-Size Distribution of Resist Solution>

The particle-size distribution of the resist solution at 25° C. was measured using Zetasizer Nano ZS of Malvern Instruments Co. The result indicated that the average particle diameter of the photosensitive core-shell type nano-particles was 1.1 nm.

<Evaluation in Post-Coating Delay (PCD) Characteristics of Resist After Coating>

The resist solution obtained was applied on a silicon wafer by spin-coating, and dried by heating at 100° C. for 60 seconds, thus forming a resist film having a thickness of 50 nm, as a sample. Two samples were prepared.

Then, the first sample was exposed to EUV and developed with butyl acetate for 30 seconds. The sensitivity curve of the sample was obtained. Meanwhile, the second sample was let stand for 5 hours in clean room, and then exposed to EUV, followed by development with butyl acetate for 30 seconds. The sensitivity curve of the sample was obtained. The result indicated that no change was observed in sensitivity between the second resist film, which was let stand for 5 hours, and the first resist immediately after coating.

Thus, it has been confirmed that the resist film prepared in Example 2 has a long-term stability.

<Evaluation of Patterning Characteristics of Resist>

The resist solution obtained was applied on a silicon wafer by spin-coating, and dried by heating at 100° C. for 60 seconds, thus forming a resist film having a thickness of 50 nm. Then, the resist film was exposed to EUV through a mask at a light exposure of 20 mJ/cm$^2$ and developed with butyl acetate for 30 seconds, thus forming a pattern.

The obtained pattern was observed under a scanning electron microscope. The result indicated that the pattern was produced with high fidelity as a line width of 20 nm to the mask.

Example 4

<Preparation Example 5 of Resist Solution>

1 g of the obtained great number of photosensitive core-shell type nano-particles synthesized in Example 1 and 0.1 g of 1,3-dioxo-1,3,3a,4,7,7a-hexahydro-2H-4,7-methanoisoindole-2-yltrifluoromethanesulfonate, which is a photo acid generator, were dissolved into 22 g of propyleneglycol-1-monomethylether-2-acetate, and thus a resist solution was prepared.

<Evaluation in Post-Coating Delay (PCD) Characteristics of Resist After Coating>

The resist solution obtained was applied on a silicon wafer by spin-coating, and dried by heating at 100° C. for 60 seconds, thus forming a resist film having a thickness of 50 nm, as a sample. Two samples were prepared.

Then, the first sample was exposed to EUV and developed with butyl acetate for 30 seconds. The sensitivity curve of the sample was obtained and the result indicated that the sensitivity was 5 mJ/cm$^2$.

Meanwhile, the second sample was let stand for 12 hours in clean room, and then exposed to EUV, followed by development with butyl acetate for 30 seconds. The sensitivity curve of the sample was obtained. The result indicated that the sensitivity was 5 mJ/cm$^2$, exhibiting no change.

Thus, it has been confirmed that the resist film prepared in Example 4 has a long-term stability.

<Evaluation 1 of Patterning Characteristics of Resist>

The resist solution obtained was applied on a silicon wafer by spin-coating, and dried by heating at 100° C. for 60 seconds, thus forming a resist film having a thickness of 50 nm. Then, the resist film was exposed to EUV using an EUV exposure device through a mask at a light exposure of 9 mJ/cm$^2$ and developed with butyl acetate for 30 seconds, thus forming a pattern.

The obtained pattern was observed under a scanning electron microscope. The result indicated that the pattern was produced with high fidelity as a line width of 20 nm to the mask.

<Evaluation 2 of Patterning Characteristics of Resist>

The resist solution obtained was applied on a silicon wafer by spin-coating, and dried by heating at 100° C. for 60 seconds, thus forming a resist film having a thickness of 50 nm. Then, the resist film was exposed at 43 μC/cm$^2$ of light exposure with an acceleration voltage of 100 kV using an electron-beam lithography device, and developed with butyl acetate for 30 seconds, thus forming a pattern.

The obtained pattern was observed under a scanning electron microscope. The result indicated that the pattern was fine with a line width of 20 nm and high fidelity to the pattern in the electron-beam lithography.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photosensitive composition comprising:
a great number of photosensitive core-shell type nano-particles each including a core and a shell and having a structure that the core is metal oxide particle and covered by the shell, wherein
the shell includes: a component a) an unsaturated carboxylic acid or an unsaturated carboxylate, which is a negatively ionized unsaturated carboxylic acid; and a component b) a silylated unsaturated carboxylic acid or an unsaturated carboxylate which is a negatively ionized silylated unsaturated carboxylic acid, and
the component b) is bound to the surface of the core.

2. The photosensitive composition of claim 1, wherein the metal oxide is selected from hafnium oxide, zirconium oxide or titanium oxide.

3. The photosensitive composition of claim 1, wherein each of the photosensitive core-shell type nano-particles has an average particle diameter of 1 to 5 nm.

4. The photosensitive composition of claim 1, further comprising a photo acid generator.

5. The photosensitive composition of claim 1, wherein the component a) is bound to the surface of the core, which includes the component b).

6. The photosensitive composition of claim 1, further comprising a solvent, wherein the photosensitive core-shell type nano-particles are dissolved with the solvent to obtain a solution of the photosensitive core-shell type nano-particles.

7. A pattern formation method comprising:
applying a solution of the photosensitive composition of claim 1 on a substrate to be processed;
forming a photosensitive composition film on the substrate to be processed by heat treatment;
exposing the photosensitive composition film by selectively irradiating with a high energy beam; and
developing the film exposed using a developer.

8. The pattern formation method of claim 7, wherein the high energy beam is extreme ultraviolet radiation.

9. A pattern formation method comprising:
providing a solution of a photosensitive composition comprising a great number of photosensitive core-shell type nano-particles each including a core and a shell and having a structure that the core is covered by the shell;
applying the solution of the photosensitive composition on a substrate to be processed;
forming a photosensitive composition film on the substrate to be processed by heat treatment;
exposing the photosensitive composition film by selectively irradiating with extreme ultraviolet rays; and
developing the film exposed using a developer, wherein
the core is an oxide of a metal selected from the group consisting of Ti, Zr and Hf,
the shell includes: a component a) an unsaturated carboxylic acid or an unsaturated carboxylate, which is a negatively ionized unsaturated carboxylic acid; and a component b) a silylated unsaturated carboxylic acid or an unsaturated carboxylate which is a negatively ionized silylated unsaturated carboxylic acid, and
the component b) is bound to the surface of the core.

* * * * *